US005864261A

United States Patent [19]
Weber

[11] Patent Number: 5,864,261
[45] Date of Patent: *Jan. 26, 1999

[54] MULTIPLE LAYER ACOUSTICAL STRUCTURES FOR THIN-FILM RESONATOR BASED CIRCUITS AND SYSTEMS

[75] Inventor: Robert J. Weber, Boone, Iowa

[73] Assignee: Iowa State University Research Foundation, Ames, Iowa

[ * ] Notice: This patent issued on a continued prosecution application filed under 37 CFR 1.53(d), and is subject to the twenty year patent term provisions of 35 U.S.C. 154(a)(2).

[21] Appl. No.: 789,404

[22] Filed: Jan. 29, 1997

Related U.S. Application Data

[63] Continuation of Ser. No. 641,139, Apr. 23, 1996, abandoned, which is a continuation of Ser. No. 248,870, May 23, 1994, abandoned.

[51] Int. Cl.⁶ ........................................................ H03H 9/17
[52] U.S. Cl. ............................................. 333/187; 310/321
[58] Field of Search ..................................... 333/187, 188, 333/189, 190, 191, 192; 310/321, 324, 334

[56] References Cited

U.S. PATENT DOCUMENTS

| | | | |
|---|---|---|---|
| 3,568,108 | 3/1971 | Poirier | 333/187 |
| 4,166,967 | 9/1979 | Benes et al. | 310/339 X |
| 4,456,850 | 6/1984 | Inoue et al. | 310/324 |
| 4,502,932 | 3/1985 | Kline | 204/192 |
| 4,642,508 | 2/1987 | Suzuki et al. | 310/321 |
| 4,719,383 | 1/1988 | Wang et al. | 310/324 |
| 5,373,268 | 12/1994 | Dworsky et al. | 333/187 |

FOREIGN PATENT DOCUMENTS

WO93/24971 12/1993 WIPO.

OTHER PUBLICATIONS

W. E. Newell, "Face–Mounted Piezoelectric Resonators," Proceedings of the IEEE, Jun. 1965, pp. 575–581.
"Applications of Ain Thin–Film Resonator Topologies as Antennas and Sensors"; Weber et al; IEEE MTT Symposium Digest; pp. 161–164, 1992.
"Thin Film Piezoelectric Resonating Device"; Collins Radio Company Engineering Proposal; Feb. 26, 1965.
Lakin, Wang, Kline, Landin, Chen, and Hunt; "Thin Film Resonators and Filters"; 1982—Ultronics Symposium; 10 pages (pp. 466—475).
Lakin, Kline, Ketcham, Landin, Burkland, McCarron, Braymen, Burns; "Thin Film Resonator Technology"; 41st Annual Frequency Control Symposium—1987; 1987; 11 pages (pp. 371—381).

*Primary Examiner*—Robert Pascal
*Assistant Examiner*—Justin P. Bettendorf
*Attorney, Agent, or Firm*—Leydig, Voit & Mayer, Ltd.

[57] ABSTRACT

A stacked thin film device structure grown on a substrate, the resonator structure comprising a thin film device comprising at least one piezoelectric crystal layer sandwiched between metallic electrodes, and constructed to have an acoustic response in a given frequency range, and an acoustical stack disposed between and joining the thin film device and the substrate and comprising multiple layers of material, each layer having a characteristic thickness and impedance and being composed of a non-lossless material, the characteristic thicknesses and impedances of the layers being adjusted to determine the input impedance presented to the thin film device, and thereby determining the acoustical coupling between the thin film device and the substrate.

14 Claims, 9 Drawing Sheets

MULTIPLE LAYER ACOUSTICAL STRUCTURES FOR THIN-FILM RESONATOR BASED CIRCUITS AND SYSTEMS

This is a continuation of application(s) Ser. No. 08/641,139, now abandoned, filed on Apr. 23, 1996, which is a continuation of Ser. No. 08/248,870, filed on May 23, 1994, now abandoned.

FIELD OF THE INVENTION

This present invention relates to thin film resonators, and more particularly to those operating in the microwave range.

BACKGROUND OF THE INVENTION

Thin film resonator (TFR) technology makes possible thin film acoustic devices operable in the microwave range that are compatible with active semiconductor circuitry. They are compatible with such circuitry both in the sense of being similarly sized, and in that the thin film acoustic devices can be integrated with semiconductor devices on a common substrate.

A basic thin film resonator is composed of the three basic elements common to all piezoelectric resonators: a piezoelectric dielectric, electrodes for applying electric fields, and two reflecting surfaces for establishing a standing wave. In TFR technology, thin film metallic electrodes, typically composed of aluminum, serve both as electrodes and as reflecting surfaces with the metal/air interface at the top of the resonator serving as the primary source of reflection. Sandwiched between the two electrodes is a piezoelectric layer. As the bottom metallic layer is typically grown directly on a substrate, the acoustic cavity for the resonator is defined by the aluminum-substrate composite membrane. To approximate a conventional free plate resonator, and in order to provide for high frequency operation, that membrane should be of low mass. Accordingly, it is preferable that the substrate material underlying the membrane portion of the thin film resonator be removed. Moreover, coupling between the thin film resonator and the bulk silicon would negatively impact the Q characteristics of the resonator, thus also requiring removal of the silicon substrate beneath the resonator.

A variety of techniques have been employed for the purpose of removing the substrate material beneath the resonator. In one such technique, a silicon substrate is employed with a boron doped p+ layer implanted at the upper surface which is to be adjacent the bottom aluminum electrode. This p+ layer serves as an etch stop for a selective backside chemical etch, which is performed after the resonator is fabricated on the substrate. The p+ layer itself may also optionally be removed. In either case, a via in the substrate is formed beneath the resonator, leaving it unsupported except at its edges. In an alternative technique, the thin film resonator is formed on a semiconductor substrate, and then an under cutting etch is used through a hole in the piezoelectric layer to remove the substrate material beneath the resonator. In a further alternative, a cross-over air bridge metalization pattern is used to create an air gap between the silicon and the bottom electrode of the resonator.

All of these techniques for removing material beneath the resonator share the common disadvantage of requiring multiple additional process steps after formation of the resonator to etch or otherwise remove the material underneath the resonator. Furthermore, the largely unsupported resulting structures have low yields because of the additional and complex process steps. Because of the suspended nature of these structures they are subject to damage both during processing and subsequent thereto. As a result of this fragility, thinner piezoelectric, higher frequency devices become problematic. The need for removal of this substrate material also affects how closely such resonators may be spaced, since the remainder of the silicon substrate must maintain its structural stability.

Other applications of TFR technology are similarly limited. A further example is a stacked crystal filter which utilizes a five layer structure of three alternating metal electrodes with two piezoelectric layers sandwiched therebetween. To operate properly, this device also requires the silicon substrate beneath to be removed.

Other devices utilizing TFR technology do not require etching of the silicon beneath the devices, particularly when the resonators are to be acoustically coupled through the substrate. One such example can be found in the inventor's published PCT application, bearing International Publication Number WO93/24971 published Dec. 9, 1993. That application discloses an acoustically coupled antenna using an overmoded configuration. In that case, a thin film resonator is grown on either side of a silicon substrate. Each thin film resonator comprises a piezoelectric layer sandwiched between two metal, typically aluminum, electrodes. The silicon, or other semiconductor, substrate serves as a delay element between the two thin film resonators. When the silicon has a thickness substantially equal to a multiple of one-half wave length of the desired frequency of the pre-determined frequency band, the two thin film resonators become acoustically coupled in that pre-determined frequency band. Thus, while the requirement for etching of the silicon substrate has been eliminated in this device in order to provide coupling between the resonators, it is useful primarily in this antenna configuration. This is due to the fact, as mentioned previously, that the presence of the silicon substrate under a single, uncoupled resonator prevents conventional free plate resonance, as well as affecting the resonator Q because of transmission of the acoustic radiation into the substrate. Further, the overmoded structure also places a constraint on the thickness on the silicon, since it must be an integral multiple of one-half the wave length of a desired frequency in the predetermined frequency band of the resonators.

SUMMARY OF THE INVENTION

In view of the foregoing, it is an important aim of the present invention to produce thin film device structures in which isolation from (or coupling to) the supporting substrate is accomplishing by means other than removal of (or adjustment of the thickness of) the substrate below the resonator.

In accordance with that aim, it is a primary object of the invention to provide improved functioning thin film device structures that can be easily and reliably fabricated.

A related object of the invention is to provide for fabrication of thin film device structures without need for special processing steps outside of typical semiconductor fabrication processes.

It is a further related object to provide thin film device structures that do not require special etching steps for such removal.

A further object is to provide a thin film resonator that works under higher power conditions, and that can withstand high energy levels.

Yet a further object is to provide thin film resonators that operate at high frequencies.

In accordance with the present invention, there is provided a thin film device structure comprising a thin film device including at least one piezoelectric layer sandwiched between two metal electrodes, which is supported on the underlying semiconductor substrate by means of an acoustical stack. This acoustical stack is comprised of multiple layers of non-lossless material, which potentially includes conductors, semiconductors, insulators, piezoelectrics, magnetics, and dielectrics. The thickness and characteristic impedances of the various layers are adjusted to determine whether the acoustical stack will provide coupling or acoustical isolation between the thin film device and the substrate.

In the preferred embodiment of the invention, the acoustic stack is comprised of individual stack pairs, one member of the pair having a higher impedance, and the other member of the pair having a lower impedance. The thickness of each member of the pair is equal to one quarter of the wave length of an acoustical wave having a frequency within the frequency band of the resonator. For appropriately chosen characteristic impedances of the stack pair constituents, this structure assures acoustical isolation of the resonator from the substrate. The acoustical stack formed of a plurality of such stack pairs presents a nominal input impedance to the thin film resonator. This nominal input impedance mimics a stress free boundary condition such as would be found if the resonator were coupled to air, i.e. an acoustical short circuit. Accordingly, despite the fact that the thin film resonator is firmly in contact with the substrate through the acoustical stack, it nonetheless operates as though it were a free plate resonator. Higher power and higher frequency operation is thus possible.

In an alternative embodiment of the invention, the components comprising the acoustical stack are adjusted to impedance match the thin film device and the substrate. Such a structure thus provides for full coupling of the thin film device into the substrate. With a similar thin film resonator similarly coupled to the opposite side of the substrate, full coupling between the two thin film resonators can be achieved, irrespective of the thickness of the substrate.

The two embodiments just summarized are characteristic of the invention in that they include a thin film device, and an acoustical stack disposed between the device and the substrate. According to the invention, the constituents of this acoustical stack are selected and arranged to obtain a varying range of acoustical coupling, from effectively zero to effectively one hundred percent, as may be desired for a given application.

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
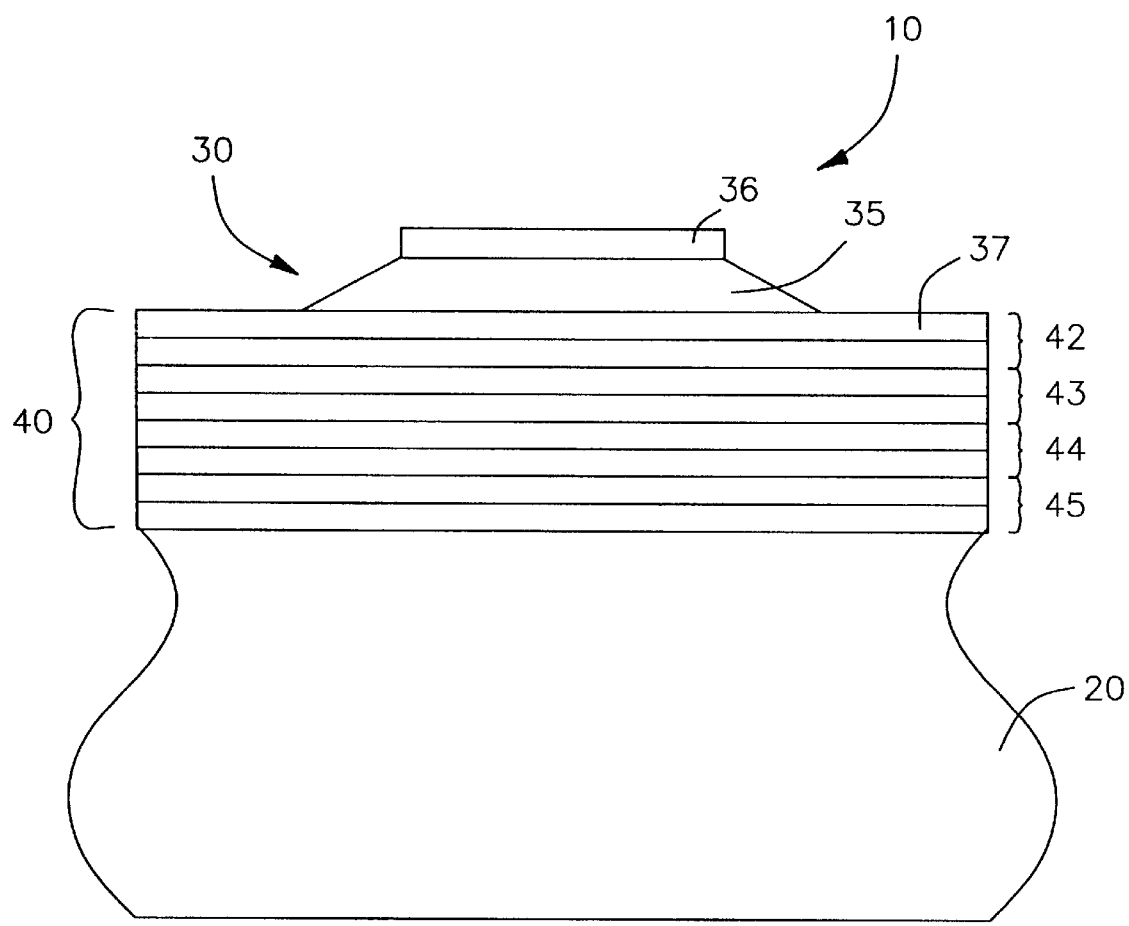
FIG. 1 is a diagram schematically illustrating a thin film structure in the form of a thin film resonator grown on a substrate, and joined to the substrate by an acoustical stack according to an embodiment of the invention.

Turning now to the drawings, FIG. 1 shows a thin film device structure 10 according to the invention. The structure 10 is grown on a semiconductor substrate 20, which may illustratively be formed of either Si or GaAs or other semiconductors. Although the embodiments disclosed herein are grown on semiconductor substrates, the invention is not so limited, and any material that can attain a high degree of flatness may be used as a substrate for thin film devices based on a planar geometry. If other types of thin film devices are used, such as those employing a confocal geometry, the substrate would be in a class of materials which can be properly polished for formation of such structures. The stacked thin film structure itself illustratively includes a thin film resonator 30. As will be known to one skilled in the art, a thin film resonator typically includes a piezoelectric layer 35 sandwiched between two metal electrodes 36 and 37. The metal electrodes 36 and 37 serve not only as electrodes for applying electric fields to the piezoelectric, but also as reflecting surfaces for establishing a resonant cavity for containing a standing wave at the resonance point of the resonator. As will be appreciated by one skilled in the art, the resonator may also include dielectric spacers between the piezoelectric crystal layer and the electrodes (not shown), for the purpose of adjusting resonator Q or bandwidth. In the embodiments disclosed herein, reference to the piezoelectric crystals as being "sandwiched" between the electrodes is intended to cover both resonators with and without dielectric spacers.

According to a significant aspect of the invention, the thin film resonator 30 is coupled to the substrate 20 by an acoustical stack 40 which is disposed between and joins the resonator 30 to the substrate 20. In this embodiment, the acoustical stack 40 is comprised of four individual stack pairs 42, 43, 44, and 45 for a total of eight layers in the acoustical stack. While this illustrative embodiment assumes that the stack pairs are identical, the invention is not so limited, and stack pairs composed of different material may be used. As can be seen from FIG. 1, the top constituent of stack pair 42 is the metallic electrode 37. Thus, that electrode serves both as an electrode of the thin film resonator, and as a constituent member of the acoustical stack coupling the thin film resonator 30 to the substrate 20.

According to this preferred embodiment, each constituent of stack pairs 42, 43, 44 and 45 has a thickness equal to one quarter the wavelength of an acoustical wave having a frequency within the narrow resonance range of the thin film resonator 30. The relevance of this particular choice of thickness will be discussed in greater detail below. In this embodiment, for each given constituent of the stack pair, the one quarter wavelength condition (λ/4) must be met with respect to the acoustical velocity within the given layer. The acoustical velocity (Va) for a thin film is given by the following equation:

$$Va = (c/\rho)^{1/2}$$

Where c is the stiffness constant of the given material, and ρ is the density of that material. Accordingly, in order for a given stack constituent to meet the λ/4 condition, the following equality must hold true with "f" representing frequency:

$$(1/4f)(c/\rho)^{1/2} = \lambda/4$$

With the constituents of each stack pair 42, 43, 44 and 45 meeting the λ/4 condition, acoustical stack 40 will serve as an acoustical isolator between resonator 30 and substrate 20 if certain conditions regarding the characteristic impedances of each stack pair constituent are met. According to the invention, this is achieved in the present embodiment by means of the constituents of each stack pair having different characteristic impedances. One constituent of the stack pair will have a relatively higher characteristic impedance, while the other constituent will have a relatively lower characteristic impedance. As an example, the stack pairs 42, 43, 44 and 45 in FIG. 1 may be comprised of chromium and aluminum. Chromium has a relatively higher characteristic impedance of $47 \times 10^6$ ohms, while aluminum has a relatively low value characteristic impedance $17 \times 10^6$ ohms. Again, it should be noted that the top constituent of stack pair 42 is also the bottom electrode to the thin film resonator 30, and is accordingly preferably composed of aluminum.

With acoustical stack 40 formed in this manner, acoustical isolation of the thin film resonator 30 from substrate 20 is achieved. This acoustical isolation typically occurs by means of the acoustical stack presenting an input impedance in the form of an acoustical short to the resonator, representing a stress free condition. As will be appreciated by one skilled in the art, the acoustical dual of this circuit could be realized. "Dual" is used here in the electromagnetism sense, where E-fields are replaced by H-fields, and currents are replaced by voltages. If the acoustical dual were used here, the acoustical stack would present an input impedance in the form of an acoustical open circuit to the resonator, representing a strain free condition. This would also result in acoustical isolation. Since the acoustical stacks, according to this invention, may either isolate the thin film device from the substrate by presenting an acoustical open or an acoustical short (i.e. a stress free or a strain free condition), these two conditions will be referred to herein as "isolation conditions", in reference to the impedance of the acoustical stacks.

In the illustrative embodiment of FIG. 1, the input impedance of the acoustical stack as seen by the thin film resonator 30 is very small. Accordingly, the input impedance presented by the acoustical stack is effectively an acoustical short circuit. The bottom surface of the piezoelectric layer 35 is effectively stress free as if the bottom electrode 37 were air. Thin film resonator 30 is thus free to resonate without any coupling to the substrate, which would lead to adverse effects on the Q of the resonator. In prior art devices, this coupling into the substrate was avoided by etching the backside via as previously discussed. With an acoustical isolator 40, according to the invention, the need for such a backside etched via is eliminated.

Figure 2:
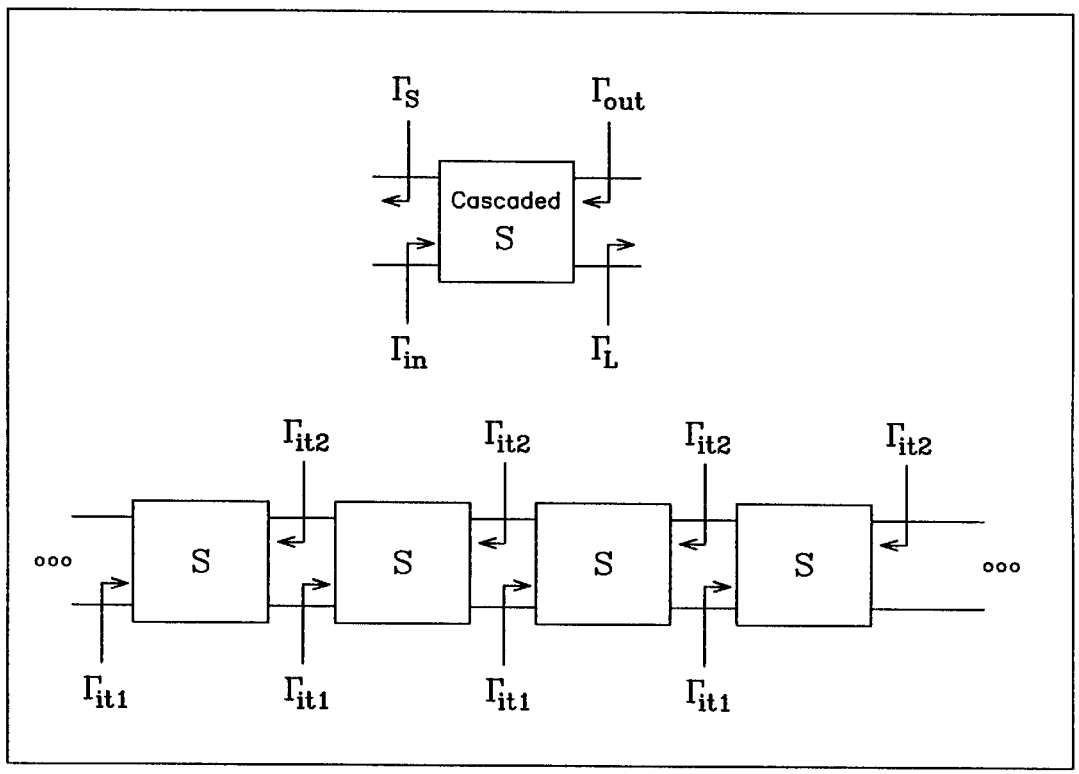
FIG. 2 is a diagram schematically illustrating a cascaded series of two port devices.

The underlying theory that led to the invention of an acoustically isolated resonator as illustratively embodied in the device of FIG. 1, shows that for a series of identical non-lossless reciprocal 180° phase shift devices cascaded in series, the input impedance into each device [hereinafter the "iterative impedance"] approaches the same value as successive layers are traversed. If each block in the cascade is represented by its scattering matrix S, the cascade shown in FIG. 2 would result. As can be seen from that figure, each S block has an input reflection coefficient $\Gamma_{it1}$ and an output reflection coefficient $\Gamma_{it2}$. The coefficient $\Gamma_{it1}$ will be shown to be a limiting value which the repeating stack will approach as an acoustic wave propagates through the stack. The reflection coefficient $\Gamma_{it1}$ is related to the impedance $Z_{it1}$ by the defining formula:

$$\Gamma_{it1} = \frac{Z_{it1} - Z_o}{Z_{it1} + Z_o}$$

$Z_o$ is the acoustical reference impedance of the stack. While the choice of $Z_o$ is arbitrary, $Z_o$ is usually chosen as the characteristic impedance of either the substrate or the piezoelectric material. The impedance $Z_{it1}$ will be referred to herein as the iterative impedance, and also represents a limiting value. As a sufficient number of layers are traversed, the impedance of the stack approaches this limiting value. Returning to FIG. 2, the overall repeating structure also has an overall input reflection coefficient $\Gamma_{in}$ and output reflection coefficient $\Gamma_{out}$. Finally, the source and load reflection coefficients are represented by $\Gamma_S$ and $\Gamma_L$. In the repeating structure, if the condition $\Gamma_{in} = \Gamma_{it1}$ is assumed, then $$\Gamma_{in} = \Gamma_{it1} = \frac{S_{11} - \Delta_s \Gamma_{it1}}{1 - S_{22} \Gamma_{it1}} \quad (1)$$

where $\Delta_s = S_{11} S_{22} - S_{12} S_{21}$ with the notation $S_{xx}$ representing elements in the scattering matrix S. Solving for $\Gamma_{it1}$ gives:

$$\Gamma_{it1} = \frac{(1 + \Delta_s) \pm [(1 + \Delta_s)^2 - 4 S_{11} S_{22}]^{1/2}}{2 S_{22}} \quad (2)$$

If a similar assumption is made for $\Gamma_{it2}$ that it is equal to $\Gamma_{out}$, then:

$$\Gamma_{it2} = \frac{(1 + \Delta_s) \pm [(1 + \Delta_s)^2 - 4 S_{11} S_{22}]^{1/2}}{2 S_{11}} \quad (3)$$

Each S block two-port is passive, reciprocal and lossy. Accordingly, simultaneous conjugate matches $Z_{m1}$ and $Z_{m2}$ exist for each S block, yielding reflection coefficients: $\Gamma_{m1}$ and $\Gamma_{m2}$. Lossless two ports would not exhibit a conjugate match with positive real impedances. However, since the two port here is assumed to be passive and non-lossless, $Z_{m1}$ and $Z_{m2}$ are positive real. If $\Gamma_{it2}$ previously derived describes a purely real impedance $Z_{it2}$, then a new S matrix, normalized to $Z_{it2}$ can be described:

$$(S') = \begin{pmatrix} S'_{11} & S'_{12} \\ S'_{21} & 0 \end{pmatrix}$$

Using this S matrix, equation (2) becomes:

$$\Gamma_{in} = \Gamma_{it1} = S'_{11} + S'_{12} S'_{21} \Gamma_{it1}$$

and $$\Gamma_{it1} = \frac{S'_{11}}{1 - S'_{12} S'_{21}}$$

If a small perturbation δ is introduced into the overall load reflection coefficient of such a system, it can be shown that after a series of iterations, each representing passage of an acoustical wave through one of the cascaded S blocks, the input reflection coefficient asymptotically approaches the reflection coefficient $\Gamma_{it1}$ associated with the iterative impedance $Z_{it1}$.

Figure 3:
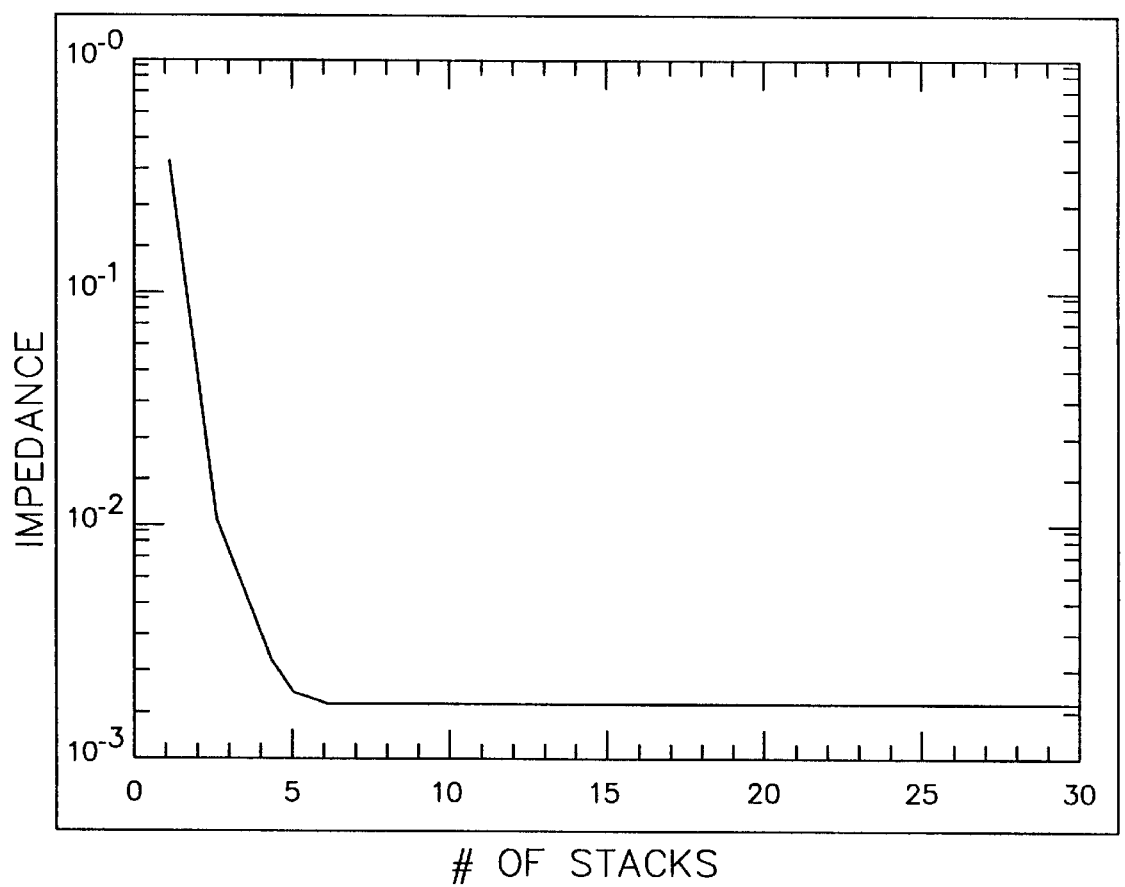
FIG. 3 is a graph of the input impedance versus the number of stack pairs for an acoustical stack having quarter wavelength thickness constituents.

Accordingly, for a cascaded series of non-lossless S blocks as just described, the acoustical input impedance into the stack asymptotically approaches a very small iterative impedance. This is represented in the graph of FIG. 3. The y axis of that graph shows the acoustical input impedance into a cascaded series of such S blocks wherein each S block is comprised of 2 layers of alternating high and low impedance. The x axis is the number of such cascaded S blocks. This theoretical graph was generated with the simplifying assumption that the various layers all had the loss associated with Al at 1 GHz. Three S blocks according to the invention typically allow only about 0.001 of the energy to pass through the stack into the substrate. For the purposes of this invention, three stacks thus provide the desired acoustical isolation of a thin film device from its substrate. Since each S block is composed of two layers, a minimum of 6 total layers would be required. For greater numbers of stacks, even smaller amounts of energy couple into the substrate, but only incrementally smaller amounts of energy are coupled for increased stack number.

The simplest way to achieve a non-lossless S block having the characteristics necessary to achieve an iterative impedance is by means of using cascaded, alternating impedance, non-lossless quarter wave sections to form the S block. Accordingly, such cascaded alternating impedance quarter wave sections were used to form the stack pairs 42, 43, 44 and 45 in the illustrative embodiment of FIG. 1. Even though four stack pairs are shown, 3 are sufficient, leading to a total of six layers. Each of those stack pairs, then, represents an S block as described above in the theoretical description of the invention. Accordingly, by choosing the constituents of each stack pair to have the λ/4 thickness, and the required alternating relatively high and relative low impedances, acoustical isolation of the thin film resonator 30 from the substrate 20 can be advantageously achieved. The known acoustical impedances of the materials typically are substituted into the above series of equations to determine whether a given set of high and low impedance materials with quarter wavelength thicknesses will give the desired isolation. If the resulting iterative impedance is low enough so that it does not adversely affect the resonator Q (e.g. the resulting Q is such that the resonator remains usable for practical applications), that pair of materials is appropriate for building the acoustical isolator according to the invention.

The thin film device structure in FIG. 1 could be designed to operate with a resonance frequency of 5 GHz if the piezoelectric layer 35 were formed of AlN approximately 0.9 microns thick, with a 0.2 micron thick aluminum top electrode 36. For 5 GHz operation, the constituents of the stack pairs 42, 43, 44 and 45 would all have approximately a 0.3 micron thickness, and the characteristic impedances previously discussed. Such a resonator gives very advantageous 5 GHz operating characteristics. Moreover, unlike previous thin film resonators, there is no need for the resonator structure to be unsupported. Rather, because the acoustical isolator 40 provides the necessary acoustical isolation from the substrate 20, the resonator 30 may be fully mechanically supported, while still acting as if it were completely unsupported. Because this structure is fully mechanically supported, it is more robust, and not subject to damage subsequent to processing. Moreover, since the individual layers and the piezoelectric can be deposited by conventional semiconductor processing techniques, formation of this device is fully compatible with other processing that may be occurring on the same substrate. No additional backside or undercutting etch step is necessary to remove the substrate from beneath the resonator. A device according to FIG. 1, is thus more reliably and economically formed, as well as having improved performance characteristics.

Figure 4:
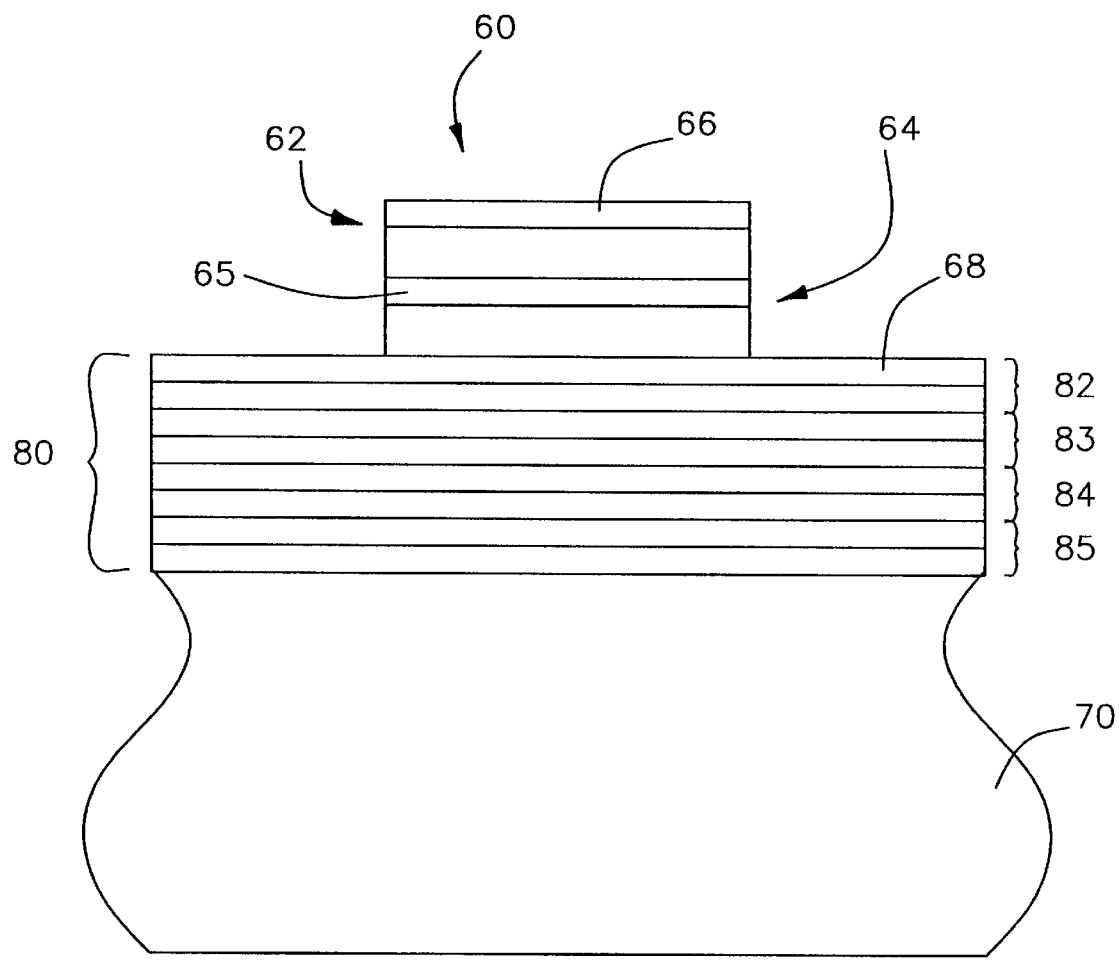
FIG. 4 is a diagram schematically illustrating an isolated stacked crystal filter according to an embodiment of the invention.

While the invention has been illustrated by means of the embodiment of FIG. 1, it is not so limited. Other structures may also be advantageously formed on acoustical isolators like the one just described. For example, in an alternative, but related embodiment, a similar acoustical isolator can be employed to isolate a stacked crystal filter formed of two thin film resonators. Such a structure is shown in FIG. 4. The stacked crystal filter 60 is comprised of two thin film resonators 62 and 64, which share a common electrode 65. The top and bottom electrodes 66 and 68, respectively, complete the five layer sandwiched structure of the stacked crystal filter. According to this invention, the need for etching of a via under the filter may be eliminated by acoustically isolating the stacked crystal filter from the substrate, as is shown in FIG. 4. The substrate 70 is illustratively Si or GaAs. Disposed between and joining the stacked crystal filter 60 and the substrate 70 is an acoustical stack 80 in the form of an acoustical isolator as described previously. That is, the acoustical isolator is comprised of stacked pairs 82, 83, 84 and 85 meeting the λ/4 condition, and also meeting the condition of each stack pair having one constituent of relatively high impedance and one constituent of relatively low impedance. As in the previous embodiment, the top constituent of the top stack pair 82 is also the bottom electrode of the stacked crystal filter 60. By means of the acoustical isolation provided by acoustical stack 80 in this embodiment, the need for etching a via in the substrate 70 to provide isolation is eliminated.

Figure 5:
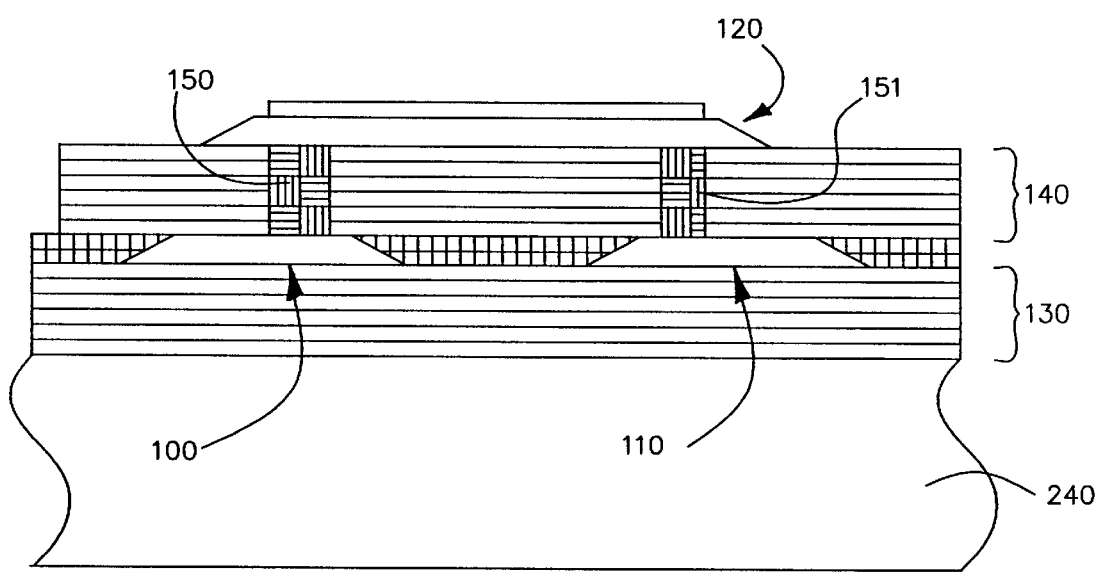
FIG. 5 is a diagram schematically illustrating a multiple pole filter using multiple resonators according to an embodiment of the invention.

The use of acoustical stacks to support thin film resonators may also advantageously be used in an alternative embodiment to provide an improved multiple pole filter structure. Such a structure is shown in FIG. 5. The multiple pole filter uses acoustical coupling between otherwise isolated resonators in order to control the coupling coefficient between the resonators, thus allowing greater flexibility in defining the bandwidth of the filter structure. The filter structure shown in FIG. 5 includes three separate thin film resonators 100, 110, and 120. The two resonators 100 and 110 are both formed on top of an acoustical stack 130 in the form of an acoustical isolator, in accordance with this invention. Each resonator is thus isolated both from the substrate and from the other resonator. Similarly, resonators 100 and 110 are substantially acoustically isolated from resonator 120 by means of a second acoustical stack 140 in a form of an acoustical isolator. At the same time, controlled coupling between resonator 120 and resonators 100 and 110, respectively, is provided by means of acoustical coupling plugs 150 and 151. The acoustical coupling plugs may illustratively be formed of any high quality acoustic material including AlN, ZnO, or polysilicon. The acoustical coupling plugs are formed to have a specific cross-sectional area over which energy is allowed to couple from resonator 120 to either of the two lower resonators. By means of controlling this area, the coupling coefficient between resonator 120 and resonators 100 and 110, respectively is controlled. In the area of the coupling plugs 150 and 151, energy is allowed to flow from upper resonator 120 to the lower resonators 110 and 100. Over the remaining area of the resonators, the energy is trapped between the two acoustical stacks 130 and

140. By virtue of properly sizing the acoustical coupling plugs, the coupling coefficients and thus the bandwidth of the filter structure may be accurately controlled. A highly efficient and simple to manufacture multiple pole filter thus results. It will be appreciated by one skilled in the art that a multiple pole filter such as just described could be formed with as few as two resonators. However, for this illustrative embodiment, three resonators were used. In a two resonator structure, resonator 110 would be omitted.

Figure 6:
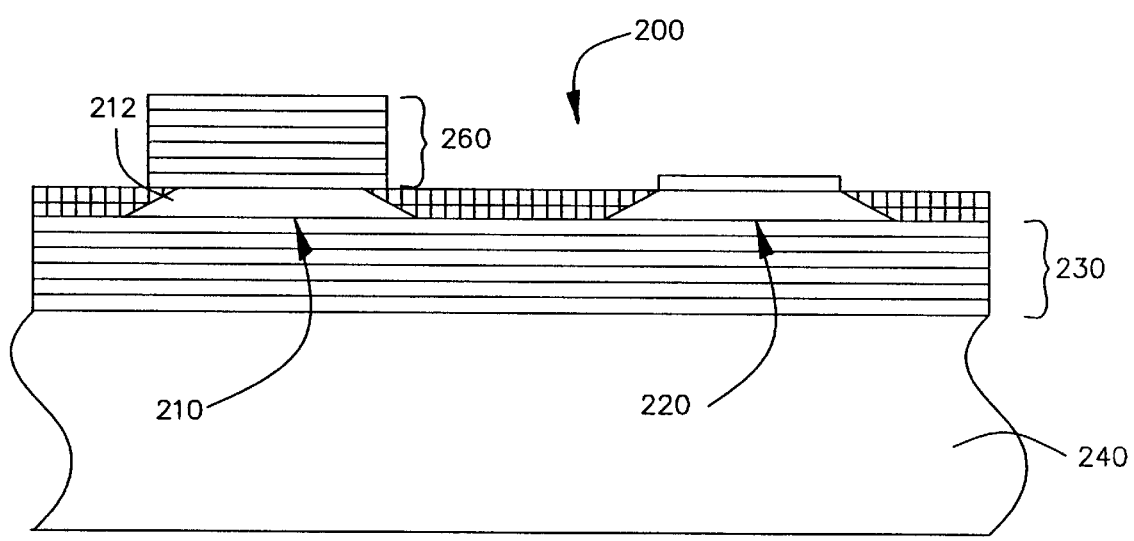
FIG. 6 is a diagram schematically illustrating a sensor including resonators and isolation stacks according to an embodiment of the invention.

A further representative example of use of an acoustical stack in the form of an acoustical isolator may be seen in reference to FIG. 6, which shows a sensor 200 including a reference resonator 210 and a sensing resonator 220. Both resonators 210 and 220 are formed on top of an acoustical stack 230 in the form of an acoustical isolator. Stack 230 thus serves to acoustically isolate the resonators 210 and 220 from the substrate 240, without the need for a backside etching of the substrate 240. Since the resonators are built on top of the acoustical isolator 230, the substrate 240 is isolated from the resonators. Thus, the building of multiple resonators on a single substrate is made possible by use of an acoustical isolator since the substrate will not serve as a means for coupling the energy between the two resonators. In this embodiment, the reference resonator 210 is completely isolated from its environment by including a further acoustical stack 260 in the form of an acoustical isolator, that is disposed on top of the resonator 210. The reference resonator 210 thus has low input impedance acoustical isolators on either side of the piezoelectric material 212 forming the reference resonator 210. According, resonator 210 freely resonates without exposure to the outside environment, or suffering any adverse effects in its resonance characteristics therefrom. Distinctly, the sensing resonator 220 does not include an overlaying acoustical isolator as does reference resonator 210. Accordingly, the sensing resonator 220 is exposed to the environment, and is exposed to the changes in its frequency characteristic that changes in the environment may bring. Accordingly, by monitoring the signals from each of the two resonators, changes in the environment may be detected by means of comparing the output of the reference resonator 210 and the sensing resonator 220. Such detection methods will be well known to those skilled in the art. Significantly, the use of an acoustical isolator according to the invention provides both for isolation of the reference resonator 210 and sensing resonator 220 from each other, and also allows reference resonator 210 to be isolated from the environment, without adversely effecting its characteristics. This is made possible by the fact that acoustical isolator 260 presents an input impedance to the resonator 210 so that it meets an isolation condition (either an acoustical open or short) as previously defined herein.

Figure 7:
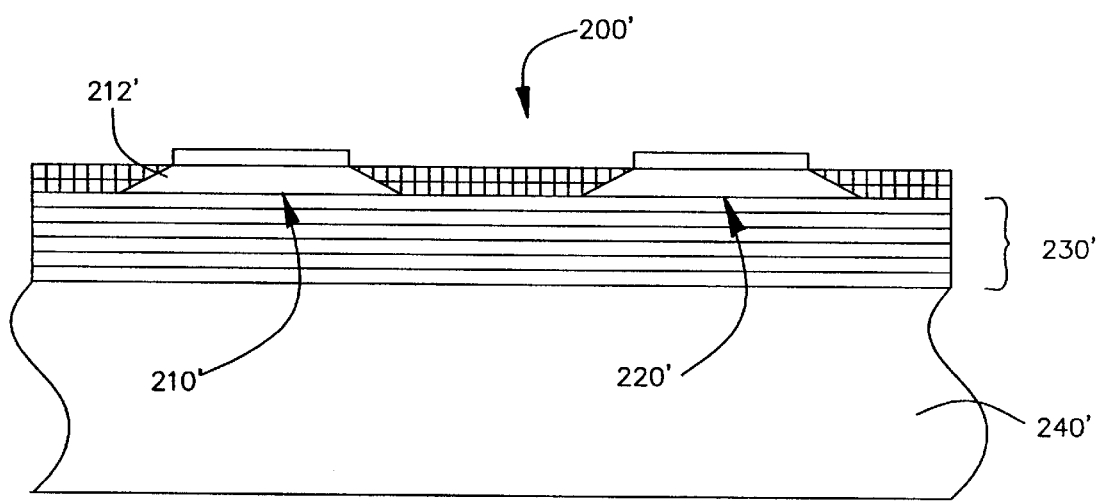
FIG. 7 is a diagram schematically illustrating another sensor including resonators and isolation stacks according to an embodiment of the invention.

As an alternative sensor, the structure of FIG. 7 could be used. In that structure, primed numbers are used to refer to elements like those of FIG. 6. In this embodiment, reference resonator 210' does not include an overlying isolator. Rather, the sensing resonator 220' is treated to be particularly sensitive to the environmental condition of interest. The same result as the device of FIG. 6 applies. Namely, sensing resonator 220' is made relatively more sensitive to the environment than is reference resonator 210'. Further, multiple sensing resonators could be used. Since the area of the sensor is relatively small, as compared to sensors where in a backside etch is used, the use of multiple sensors of one or more types, each referenced to the reference sensor, is facilitated.

Figure 8:
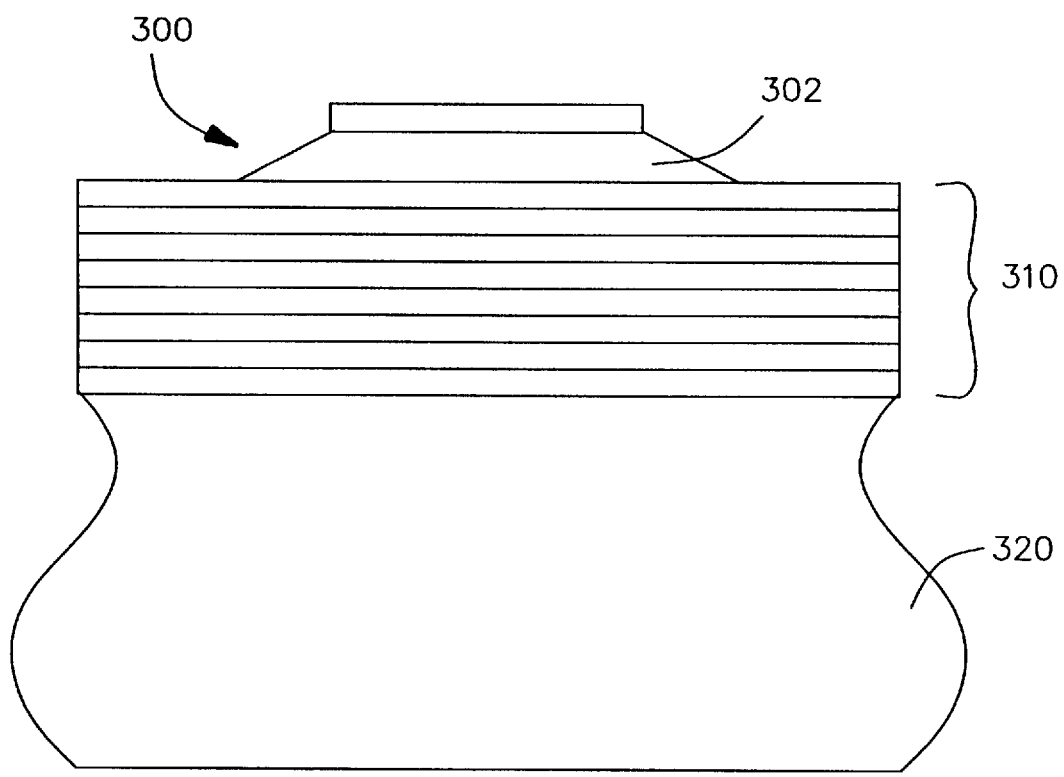
FIG. 8 is a diagram schematically illustrating an overmoded resonator using an acoustical stack according to an embodiment of the invention.

The benefits of an acoustical isolator may also illustratively be used in an overmoded resonator structure, as shown in FIG. 8. The overmoded resonator of FIG. 8 is simply a thin film resonator 300 having a piezoelectric layer 302 with a thickness equal to an integral multiple of the half wavelength of the frequency of interest. As will be appreciated by one skilled in the art, the thickness of the piezoelectric layer in such a resonator is typically one half the wavelength of the desired resonance frequency. In an overmoded structure, however, a higher integral multiple, such as 3/2 or 5/2 of the wavelength is used as the thickness for the piezoelectric layer. Accordingly, higher order resonator modes will also be present in the resonator. However, by use of an acoustical stack 310 in the form of an acoustical isolator according to the invention, such an overmoded structure is made possible. Because the acoustical isolator 310 is designed to only isolate the resonator 300 from the substrate 320 within the frequency range of the resonator, the higher order modes of the resonator will fall outside of that frequency band. Accordingly, those modes will be coupled into the substrate, leading to significantly reduced Q factors for those frequencies. Thus, use of the acoustical isolator 310 according to the invention allows the benefit of an overmoded resonator structure, i.e. the use of thicker piezoelectric layers then would otherwise be required for the desired frequency, while not adversely affecting the performance of that resonator. Since thicker piezoelectrics are possible for a given frequency, this configuration allows higher frequencies to be reached without the need for thinner piezoelectric layers.

While the acoustical stacks in the above examples were all formed of identical stack pairs resulting in alternating quarter wavelength thick layers, the constituents of an effective acoustical stack are not so limited. Rather, the thickness of individual constituents of each stack may be different, assuming that the characteristic impedances of each constituent are also different. Indeed, an effective acoustical stack according to the invention, could be formed of multiple layers of different materials, and having thicknesses and impedances adjusted to achieve the desired result. Alternatively, stack pairs like those referred to above can be used, with each stack pair being composed of a different pair of materials. Further, in the case of two materials of different thickness and impedance, an individual stack pair may also be used for impedance matching of a thin film device to the substrate below. Alternatively, such a stack pair may be used as an iterative block in the S block formalism discussed above. In either case, by properly selecting the impedance and thickness of the constituents of an acoustical stack or individual stack pairs, the desired acoustical stack properties may be arrived at.

In the case where a stack pair is to be used for impedance matching of a thin film device grown over a substrate, with a stack pair disposed between and joining the substrate to the thin film resonator, the analysis is carried out on a two port structure assuming terminating impedances of (1) the impedance of the thin film device and (2) the impedance of the substrate, respectively. The phase lengths $\theta$ for each constituent of the stack pair can be determined by carrying out a transmission line analysis using standard ABCD formalism and assuming a lossless line. Once the $\theta$ values are determined in this manner, the S matrix of the two port including its non-lossless characteristics then can be determined to calculate the input impedance for the stack pair. If the resulting input impedance is such that the desired impedance matching is achieved, the stack pair can be used for coupling the thin film device to the substrate according to the invention. One skilled in the art will appreciate that this is conventional use of perturbation. Lossless material is assumed for determining $\theta$, then the lossless $\theta$, good to a first order approximation for the lossy case, is used to calculate the response (e.g. calculate the S matrix) for the lossy case. If the stack pair is being used for isolating the thin film device from the substrate, a similar calculation is carried out. Two materials are selected to comprise a stack pair, based on various considerations including their characteristic impedance. Losslessness is assumed to calculate the lengths θ, then those values are substituted in to the lossy case to calculate iterative impedances. This more general mathematical formulation and technique can also be used for calculation where non-identical stack pairs are used in the acoustical stack or where "pairs" are not used at all, to achieve either isolation or matching according to the invention.

Figure 9:
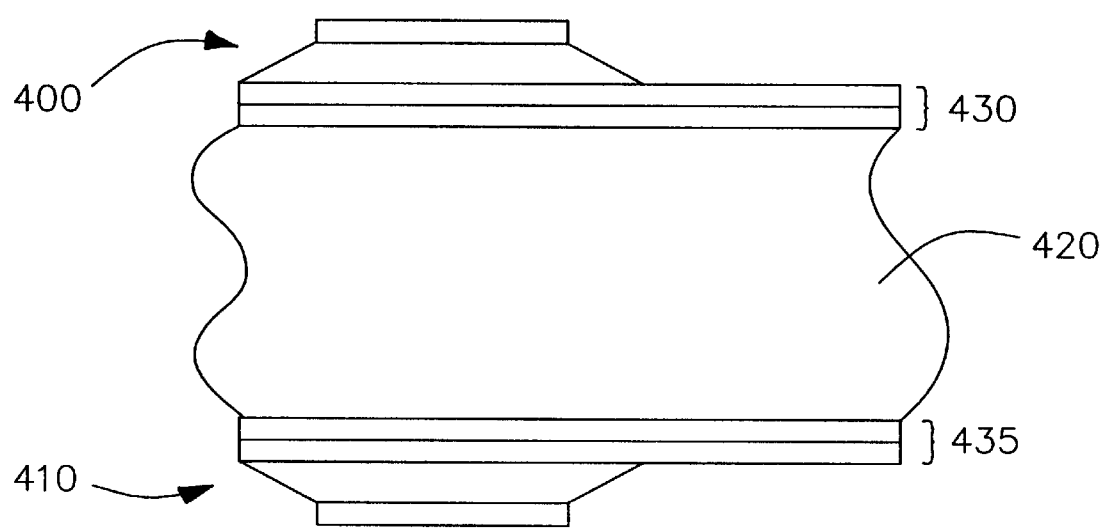
FIG. 9 is a diagram schematically illustrating an overmoded antenna using acoustical stacks according to an embodiment of the invention.

A device using a stack pair resulting in impedance matching is shown in FIG. 9. The device is an overmoded antenna structure utilizing two thin film resonators 400 and 410 on either side of a common substrate 420 a single stack pair is disposed between each resonator 400, 410 and a substrate 420. The thickness and impedances of these stack pairs 430 and 435 were calculated to provide impedance matching between the resonators 400, 410 and the substrate 420. Since there is impedance matching, there is no reflection of the acoustical wave at the interface between the stack pairs 430 and 435 and the substrate 420. Accordingly, acoustical energy passes directly through the substrate, and serves to acoustically couple the two resonators 400 and 410. Thus, an overmoded antenna structure results. In previous such devices, the thickness of the substrate had to be carefully controlled so that it was an integral multiple of half the wavelength. According to this embodiment, which includes the advantageous stack pair according to the invention, such control of substrate thickness is not required. Rather, coupling is achieved by providing impedance matching between the resonators and the substrate.

For the case of using the acoustical stack for either impedance matching or acoustical isolation, choice of the constituents of the individual stack pairs may be made based on more than just the material's characteristic impedance. Indeed, a wide array of materials may be used to form the stack layers, including conductors, insulators, piezoelectrics, semiconductors, magnetics and dielectrics and different layers may be formed of different material. Among the conductors, aluminum, chromium and copper can be used. Typical deposition methods, such as CVD may be used to grow these layers, making their formation compatible with other semiconductor fabrication steps. For given applications, stack layers composed of any one of these categories of materials may be advantageous. For example, if the DC bias to a thin film device is to be provided by the substrate upon which the device is grown, at least one of the constituent members of the acoustical stack will need to be formed of a conductor, to allow this DC bias to be applied. One skilled in the art will appreciate that other design requirements will be taken into consideration in determining what type of material to use for a given layer in the acoustical stack structure. For example, the constituents of the stack may be chosen for their thermal properties, such that they provide temperature compensation to the thin film device above the stack.

There has thus been disclosed a thin film device structure grown on a substrate which includes an acoustical stack made up of layers of non-lossless material, the thickness and impedance of which will determine the level of coupling between the thin film device and the underlying substrate. If an acoustical isolator is used, thin film devices may be grown over the substrate without the previous need for etching away of the substrate to provide for free standing resonance of the thin film device. In the alternative, the acoustical stack may be used for impedance matching of the thin film device to the substrate, to provide for full acoustical coupling between the substrate and the thin film device. Further modifications and design changes may be made to the embodiments disclosed herein without departing from the scope of the invention, which is defined by the following claims.

What is claimed is:
1. A thin film resonator device, comprising:
   a thin film resonator;
   a substrate underlying and mechanically supporting the resonator, and
   an acoustical isolator disposed between and joining the resonator and the substrate and comprising layers of non-lossless material having characteristic impedances and thicknesses selected to present a nominal impedance to the thin film resonator such as would be found if the thin film resonator were coupled to air.
2. A stacked thin film device structure grown on a substrate, comprising;
   a thin film device comprising at least one piezoelectric crystal layer sandwiched between electrodes, and constructed to have an acoustic response and a given frequency range;
   an acoustical stack disposed between and joining the thin film device and the substrate and comprising multiple layers of material, each layer having a characteristic thickness and impedance and being composed of a non-lossless material, the characteristic thickness and impedances of the layers being adjusted to determine the input impedance presented to the thin film device, and thereby determining the acoustical coupling between the thin film device and the substrate; and
   wherein the acoustical stack is an acoustical isolator presenting a nominal input impedance to the thin film device mimicking an acoustical short circuit such as would be found if said thin film resonator were coupled to air, the isolator comprising a sufficient number of layers having characteristic thicknesses and impedances adjusted to cause the isolator to present an iterative impedance to the thin film device which meets an isolation condition in the given frequency range, thereby isolating the thin film device from the substrate.
3. The stacked thin film device structure according to claim 2, wherein the sufficient number is at least six.
4. The stacked thin film device structure according to claim 2, wherein the acoustical isolator is a cascaded stack of stack pairs, each stack pair constituent having a thickness equal to one quarter the wavelength of an acoustical wave in the given frequency range of the thin film device.
5. The stacked thin film device structure according to claim 4, wherein each stack pair is comprised of a first constituent having a relatively higher characteristic impedance, and a second constituent having a relatively lower characteristic impedance.
6. The stacked thin film device structure according to claim 5, wherein the first stack pair constituent is chromium, and the second stack pair constituent is aluminum.
7. The stacked thin film device structure according to claim 5, wherein the first stack pair constituent is copper, and the second stack pair constituent is aluminum.

8. The stacked thin film device structure according to claim 5, wherein three or more stacked pairs are cascaded to form the acoustical isolator.

9. The stacked thin film device structure according to claim 5, wherein the acoustical stack includes an uppermost stack pair, the top constituent of the uppermost stack pair also forming a bottom electrode for the thin film device.

10. The stacked thin film device of claim 4, wherein each stack pair is composed of different materials.

11. The stacked thin film device structure according to claim 2, wherein the thin film device is a thin film resonator.

12. The stacked thin film device structure according to claim 2, wherein the constituent material of the layers is selected to provide temperature compensation to the thin film device.

13. A thin film resonator device, comprising:

a thin film resonator;

a substrate underlying and mechanically supporting the resonator, and an acoustical isolator disposed between and joining the resonator and the substrate and comprising at least six layers of non-lossless material having characteristic impedances and thicknesses adjusted to present a nominal input impedance to the resonator which acoustically isolates the resonator and substrate.

14. A method for fabricating a thin film resonator device, comprising:

a) providing a substrate;
  1) for receiving an acoustical stack to be formed by sequentially depositing individual layers of non-lossless material on the substrate, each layer having a characteristic impedance and thickness; and
  2) for receiving a thin film device to be formed by sequentially depositing a first electrode, a piezoelectric layer, and a second electrode, the properties of the electrodes and piezoelectric layer being chosen to give the thin film device an acoustic response in a given frequency range;

b) determining the required characteristic thicknesses and impedances of each stack layer by determining the stack input impedance required to achieve acoustical isolation between the substrate and the thin film device in the given frequency range, the stack input impedance being nominal such as would be found if the thin film resonator device were coupled to air, and calculating the characteristic thicknesses and impedances to achieve that nominal input impedance;

c) depositing the layers of the acoustical stack according to the determination of step b); and d) depositing the layers of the thin film device on the acoustical stack.

* * * * *

UNITED STATES PATENT AND TRADEMARK OFFICE
CERTIFICATE OF CORRECTION

PATENT NO. : 5,864,261
DATED : January 26, 1999
INVENTOR(S) : Weber

It is certified that error appears in the above-identified patent and that said Letters Patent is hereby corrected as shown below:

Column 1,
Line 10, insert:

-- STATEMENT REGARDING FEDERALLY SPONSORED RESEARCH AND DEVELOPMENT

This invention was made in part with Government support under the United States Department of Commerce Contract No. ITA 87-02. The Government may have certain rights in this invention. --

Signed and Sealed this

Twenty-second Day of July, 2003

JAMES E. ROGAN
*Director of the United States Patent and Trademark Office*